(12) United States Patent
Guidat et al.

(10) Patent No.: US 9,233,372 B2
(45) Date of Patent: Jan. 12, 2016

(54) HYBRID MICROFLUIDIC ASSEMBLIES

(75) Inventors: Roland Guidat, Blennes (FR); Olivier Lobet, Villiers sous Grez (FR); Paulo Gaspar Jorge Marques, Le Chatelet en Brie (FR); Pierre Woehl, Strasbourg (FR)

(73) Assignee: CORNING INCORPORATED, Corning, NY (US)

( * ) Notice: Subject to any disclaimer, the term of this patent is extended or adjusted under 35 U.S.C. 154(b) by 0 days.

(21) Appl. No.: 14/126,116

(22) PCT Filed: Jun. 12, 2012

(86) PCT No.: PCT/US2012/041978
§ 371 (c)(1),
(2), (4) Date: Dec. 13, 2013

(87) PCT Pub. No.: WO2013/066418
PCT Pub. Date: May 10, 2013

(65) Prior Publication Data
US 2014/0182687 A1    Jul. 3, 2014

(30) Foreign Application Priority Data
Jun. 14, 2011 (EP) .................................... 11305744

(51) Int. Cl.
*G01N 15/06* (2006.01)
*G01N 33/00* (2006.01)
(Continued)

(52) U.S. Cl.
CPC ............. *B01L 3/527* (2013.01); *B01J 19/0093* (2013.01); *B01L 3/5027* (2013.01); *B81C 99/0095* (2013.01); *B01J 2219/00813* (2013.01); *B01J 2219/00824* (2013.01); *B01J 2219/00831* (2013.01); *B01J 2219/00871* (2013.01); *B01J 2219/00873* (2013.01); *B01J 2219/00889* (2013.01); *B01L 3/502707* (2013.01); *B01L 2200/025* (2013.01); *B01L 2200/027* (2013.01);
(Continued)

(58) Field of Classification Search
CPC ........ G01N 15/06; G01N 33/00; G01N 33/48
USPC .......... 422/50, 68.1, 502, 503, 504, 508, 509, 422/521; 436/43, 180
See application file for complete search history.

(56) References Cited

U.S. PATENT DOCUMENTS 6,337,051 B1   1/2002   Rostami et al.
6,429,025 B1   8/2002   Parce et al.
(Continued)

FOREIGN PATENT DOCUMENTS

DE   102008019556 A1   10/2009
EP       1352686 A1    10/2003
(Continued)

OTHER PUBLICATIONS

Cravotto et al.; "Intensification of organic reactions with hybrid flow reactors"; Chemical Engineering and Processing 49 (2010); pp. 930-935.

*Primary Examiner* — Brian J Sines
(74) *Attorney, Agent, or Firm* — Gregory V. Bean (57) ABSTRACT

Embodiments of hybrid microfluidic assemblies comprise at least one microstructure that is formed of transparent material and is substantially free of non-transparent material and further comprise at least one microstructure that is formed of non-transparent material and is substantially free of transparent material.

20 Claims, 5 Drawing Sheets

(51) Int. Cl.
  *B01L 3/00* (2006.01)
  *B01J 19/00* (2006.01)
  *B81C 99/00* (2010.01)

(52) U.S. Cl.
  CPC .... *B01L 2200/028* (2013.01); *B01L 2200/0689* (2013.01); *B01L 2300/0867* (2013.01); *B01L 2300/0874* (2013.01); *B01L 2300/168* (2013.01); *B81B 2201/058* (2013.01); *B81C 2201/019* (2013.01); *Y10T 137/0318* (2015.04); *Y10T 137/8359* (2015.04)

(56) References Cited

U.S. PATENT DOCUMENTS

| | | | |
|---|---|---|---|
| 6,498,353 B2 | 12/2002 | Nagle et al. | |
| 6,827,095 B2 | 12/2004 | O'Connor et al. | |
| 6,832,787 B1 | 12/2004 | Renzi | |
| 6,872,378 B2 | 3/2005 | Weimer et al. | |
| 7,605,002 B2 | 10/2009 | Summersgill et al. | |
| 7,682,565 B2 * | 3/2010 | Linton et al. | 422/68.1 |
| 7,790,124 B2 | 9/2010 | Matteo | |
| 7,952,705 B2 | 5/2011 | Shen et al. | |
| 8,221,700 B2 * | 7/2012 | Steinmiller et al. | 422/503 |
| 8,476,063 B2 * | 7/2013 | Jovanovich et al. | 435/287.2 |
| 8,557,518 B2 * | 10/2013 | Jovanovich et al. | 435/6.1 |
| 8,672,532 B2 * | 3/2014 | Jovanovich et al. | 366/181.5 |
| 8,822,206 B2 * | 9/2014 | Levchenko et al. | 435/288.5 |
| 2003/0036206 A1 * | 2/2003 | Chien et al. | 436/180 |
| 2003/0138941 A1 * | 7/2003 | Gong et al. | 435/287.2 |
| 2004/0096359 A1 | 5/2004 | Sarrut et al. | |
| 2009/0087359 A1 | 4/2009 | Roberge et al. | |
| 2009/0183791 A1 | 7/2009 | Lobet et al. | |
| 2009/0191102 A1 | 7/2009 | Lereboullet et al. | |
| 2009/0211452 A1 | 8/2009 | Masel et al. | |
| 2009/0250347 A1 * | 10/2009 | Powell et al. | 204/549 |
| 2009/0269767 A1 | 10/2009 | Soderlund et al. | |
| 2009/0286327 A1 | 11/2009 | Cho et al. | |
| 2010/0167318 A1 * | 7/2010 | Linder | 435/7.92 |

FOREIGN PATENT DOCUMENTS

| | | |
|---|---|---|
| EP | 1389175 B1 | 7/2006 |
| EP | 1679115 A1 | 7/2006 |
| EP | 1964818 A2 | 9/2008 |
| EP | 2193839 A1 | 6/2010 |
| EP | 2223741 A1 | 9/2010 |
| WO | 02/070942 A1 | 9/2002 |
| WO | 2007/073281 A1 | 6/2007 |
| WO | 2010/132412 A2 | 11/2010 |

* cited by examiner

HYBRID MICROFLUIDIC ASSEMBLIES

CROSS-REFERENCE TO RELATED APPLICATIONS

This application claims the benefit of priority under 35 U.S.C. §371 of International Application Serial No. PCT/US12/41978, filed on Jun. 12, 2012, which, in turn, claims the benefit of priority under 35 U.S.C. §119 of European Patent Application Serial No. 11305744.2, filed on Jun. 14, 2011, the contents of which are relied upon and incorporated herein by reference in their entireties as if fully set forth below.

BACKGROUND

The present disclosure is generally directed to microfluidic assemblies comprising fluidic microstructures, and, more specifically, to hybrid microfluidic assemblies comprising at least one microstructure that is formed of transparent material and is substantially free of non-transparent material and comprising at least one microstructure that is formed of non-transparent material and is substantially free of transparent material.

SUMMARY

Microfluidic assemblies, which may also be referred to as microfluidic devices, microstructured reactors, microchannel reactors, microcircuit reactors, or microreactors, are devices in which a fluid or fluid-borne material can be confined and subjected to processing. Microchannels are the most typical form of such confinement. The processing may be executed as part of a manufacturing process, and the processing may involve physical, chemical, or biological processes or combinations of these, and it may include the analysis of such processes. Heat exchange may also be provided between the confined fluid and an associated heat exchange fluid. The microfluidic assembly is usually a continuous flow device or continuous flow reactor, as opposed to a batch processing device. The internal dimensions of the microchannels provide considerable improvement in mass and heat transfer rates. Microfluidic assemblies that employ microchannels offer many advantages over conventional scale reactors, including vast improvements in energy efficiency, reaction speed, reaction yield, safety, reliability, scalability, etc.

Microfluidic assemblies may comprise a plurality of distinct fluidic microstructures, which may also be referred to as fluidic modules, that are in fluid communication with each other and are configured to execute different functions in the microreactor. For example, and not by way of limitation, an initial microstructure may be configured to mix two reactants. Subsequent microstructures may be configured for heat exchange, quenching, hydrolysis, etc, or simply to provide a controlled residence time for the mixed reactants. The various distinct microstructures must often be placed in serial or parallel fluid communication with each other. In many cases, the associated components for directing the reactants to the proper microchannels within the network can be fairly complex. Further, the components need to be configured for operation under high temperatures and pressures. Microfluidic assemblies may employ a variety of fluidic ducts, fittings, adapters, O-rings, screws, clamps, and other types of connection elements to interconnect various microstructures within the microreactor configuration.

The method by which microstructures are assembled into a microfluidic assembly and the selected materials impact the stress experienced by the component parts during use.

According to one embodiment of the present disclosure, a hybrid microfluidic assembly is provided. The hybrid microfluidic assembly comprises a microfluidic assembly housing and a plurality of microstructures disposed in the microfluidic assembly housing, each microstructure comprising one or more internal fluid passages. According to this embodiment, selected ones of the plurality of microstructures are in fluid communication with at least one other microstructure. In this embodiment, at least one of the selected microstructures comprises transparent material and is substantially free of non-transparent material, and at least one of the selected microstructures comprises non-transparent material and is substantially free of transparent material.

According to another embodiment of the present disclosure, a hybrid microfluidic assembly is provided. The hybrid microfluidic assembly comprises a microfluidic assembly housing and a plurality of microstructures disposed in the microfluidic assembly housing, each microstructure comprising one or more internal fluid passages. According to this embodiment, selected ones of the plurality of microstructures are in fluid communication with at least one other microstructure. In this embodiment, at least one of the microstructures comprises transparent material and is substantially free of non-transparent material, while the remaining microstructures comprise non-transparent material and are substantially free of transparent material. At least one microstructure comprises non-transparent material and is substantially free of transparent material. According to this embodiment, the microstructures may be interchangeably positioned to form different microfluidic assembly configurations.

According to another embodiment of the present disclosure, a method of processing fluids or mixtures of fluids with a hybrid microfluidic assembly is provided. This method comprises: introducing a fluid into a hybrid microfluidic assembly, wherein the hybrid microfluidic assembly comprises a microfluidic assembly housing and a plurality of microstructures disposed in the microfluidic assembly housing, each microstructure comprising one or more internal fluid passages, wherein selected ones of the plurality of microstructures are in fluid communication with at least one other microstructure, at least one of the microstructures comprises transparent material and is substantially free of non-transparent material, and at least one of the microstructures comprises non-transparent material and is substantially free of transparent material. The method further comprises processing the fluid within the hybrid microfluidic assembly, wherein processing comprises mixing, separating, extracting, crystallizing, precipitating, or combinations thereof.

These and additional features provided by the embodiments of the present disclosure will be more fully understood in view of the following detailed description, in conjunction with the drawings.

BRIEF DESCRIPTION OF THE DRAWINGS

The following detailed description of specific embodiments of the present disclosure can be best understood when read in conjunction with the following drawings, where like structure is indicated with like reference numerals and in which.

The embodiments set forth in the drawings are illustrative in nature and not intended to be limiting of the invention defined by the claims. Moreover, individual features of the drawings and the claims will be more fully apparent and understood in view of the detailed description.

DETAILED DESCRIPTION

As used herein, a microfluidic assembly 10 includes a plurality of coupled microstructures; however, it is contemplated that any number of microstructures may be used in the microfluidic assembly 10. Each microstructure may be configured to execute one or more functions. For example, and not by way of limitation, an initial microstructure may be configured to mix two reactants. Subsequent microstructures may be configured for heat exchange, quenching, hydrolysis, etc., or simply to provide a controlled residence time for the mixed reactants.

Figure 1:
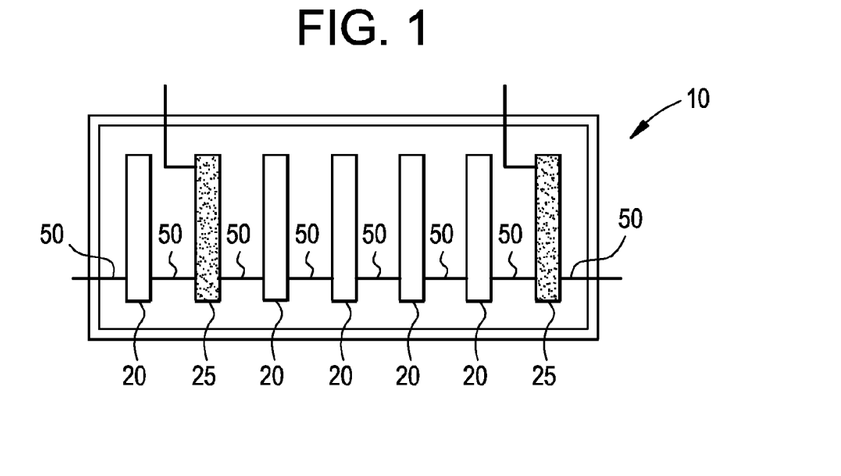
FIG. 1 is a hybrid microfluidic assembly according to one or more embodiments of the present disclosure.
Figure 2:
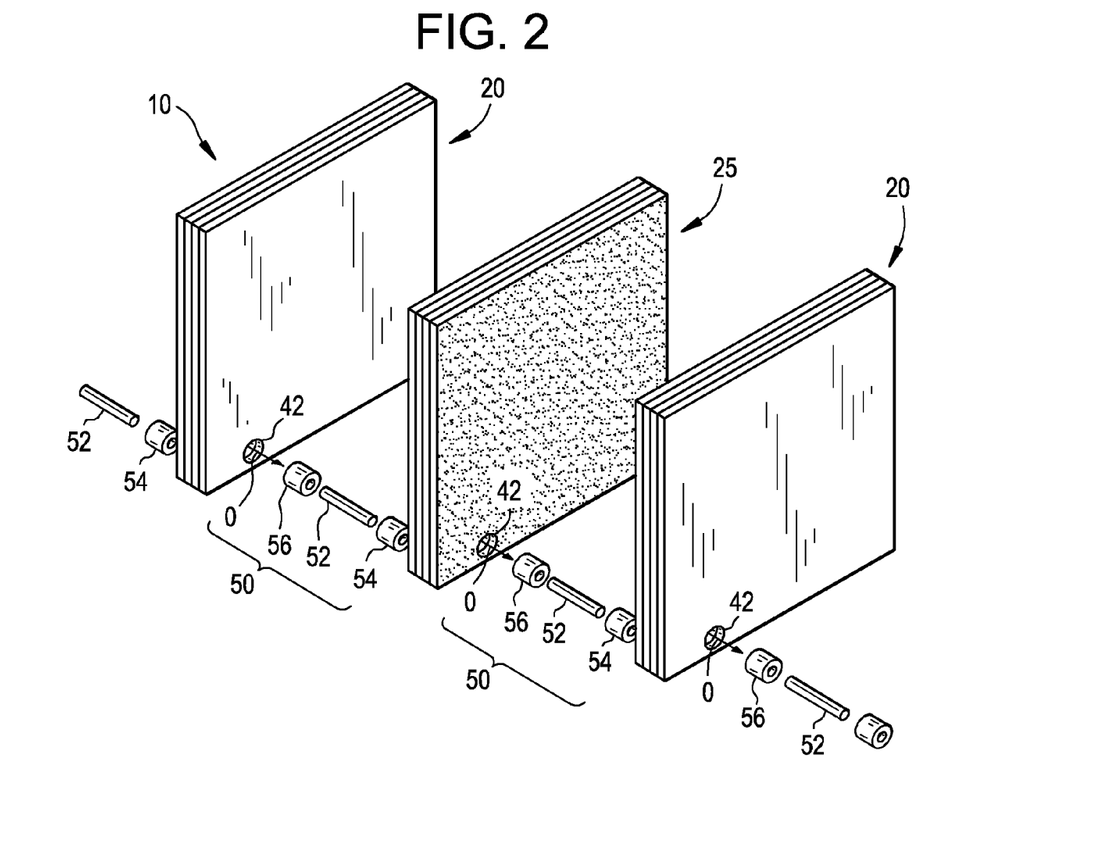
FIG. 2 is an exploded perspective view depicting a hybrid microfluidic assembly according to one or more embodiments of the present disclosure from the outlet side.
Figure 7:
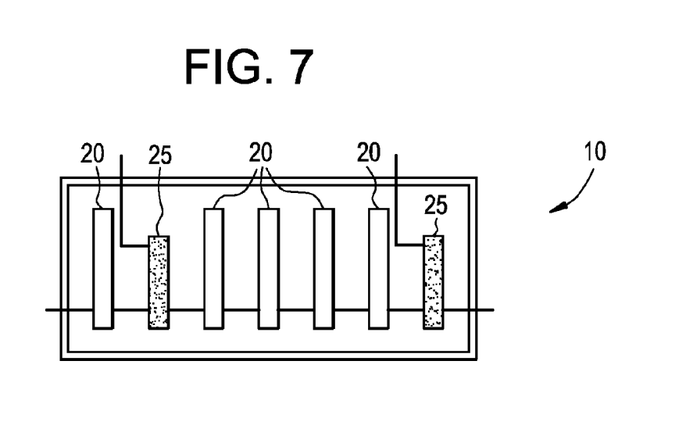
FIG. 7 is a hybrid microfluidic assembly according to one or more embodiments of the present disclosure, wherein the sizes of the microstructures vary.

Referring to FIGS. 1-2, a hybrid microfluidic assembly 10 comprises at least two adjacent microstructures coupled by at least one interconnecting fluid conduit 50. As discussed in further detail below, at least one microstructure, shown as transparent microstructure 20, comprises transparent material and is substantially free of non-transparent material. At least one microstructure, shown as non-transparent microstructure 25, comprises non-transparent material and is substantially free of transparent material. As shown in FIG. 7, the sizes of the microstructures 20 and 25 may vary within a microfluidic assembly 10.

As used herein, a microstructure is a structure having at least one microchannel, or internal fluid passage, each of which generally has a minimum cross-sectional dimension in the order of about 0.1 to about 15 mm. Microstructures hydraulic diameter range varying from 0.4 mm to 12 mm (with the hydraulic diameter being calculated as 4 A/P, wherein A is the cross-sectional area and P is the wetted perimeter of the cross-section). Microstructures 20 or 25 comprise an internal fluid passage extending between an inlet port (not shown) and an outlet port 42. The internal fluid passage is in fluid communication with the inlet port (not shown) and the outlet port 42. It is contemplated that the internal fluid passage may be curved, straight, or combinations thereof, depending on the desired residence time for the reaction. In another embodiment, the transparent microstructures 20 and non-transparent microstructures 25 include two internal fluid passages, one dedicated to reactions and one dedicated to thermal fluid.

Selected microstructures are in fluid communication with at least one other microstructure. As shown in FIG. 2, the interconnecting fluid conduit 50 may connect an outlet port 42 of one microstructure 20 or 25 to an inlet port (not shown) of an adjacent microstructure 20 or 25. In one embodiment, the interconnecting fluid conduit 50 may be straight. While various components are contemplated, the interconnecting fluid conduit 50 may comprise a straight connector 54 coupled to the inlet port (not shown), a straight connector 56 coupled to the outlet port 42, and straight tubing 52 disposed between the inlet port connector 54 and the outlet port connector 56. More complex connectors (e.g., connectors with angles or elbows) may also be used. The interconnecting fluid conduit 50 may comprise various materials, for example, metal, polymeric, or combinations thereof. The inlet port connector 54 and the outlet port connector 56 may comprise metal, rigid polymeric materials, ceramic materials, or combinations thereof. Similarly, the straight tubing 52 may comprise metal, rigid polymeric material, or combinations thereof. In one embodiment, the fluid conduit comprises metal-free materials. Such metal-free materials may comprise fluoro polymers, for example, perfluoroalkoxy material or polytetrafluoroethylene, for example, Teflon® PTFE. In another embodiment, both the fluid conduit and the connectors comprise metal-free materials. The microfluidic assembly 10 may further comprise securing devices (not shown) to couple the interconnecting fluid conduit 50 to the inlet port (not shown) and the outlet port 42. In one embodiment, the securing devices comprise clamps. In one embodiment, the fluid conduit comprises a removable interconnecting fluid conduit, the removable interconnecting fluid conduit comprising tubing.

Figure 3:
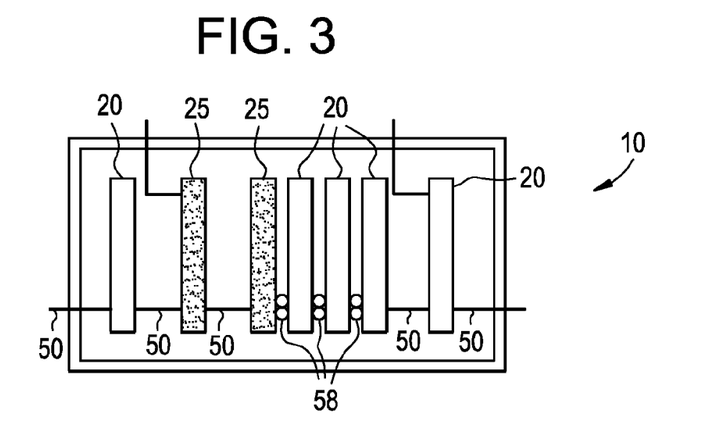
FIG. 3 is a hybrid microfluidic assembly according to one or more embodiments of the present disclosure, wherein the microstructure assembly includes mechanical stacking.
Figure 4:
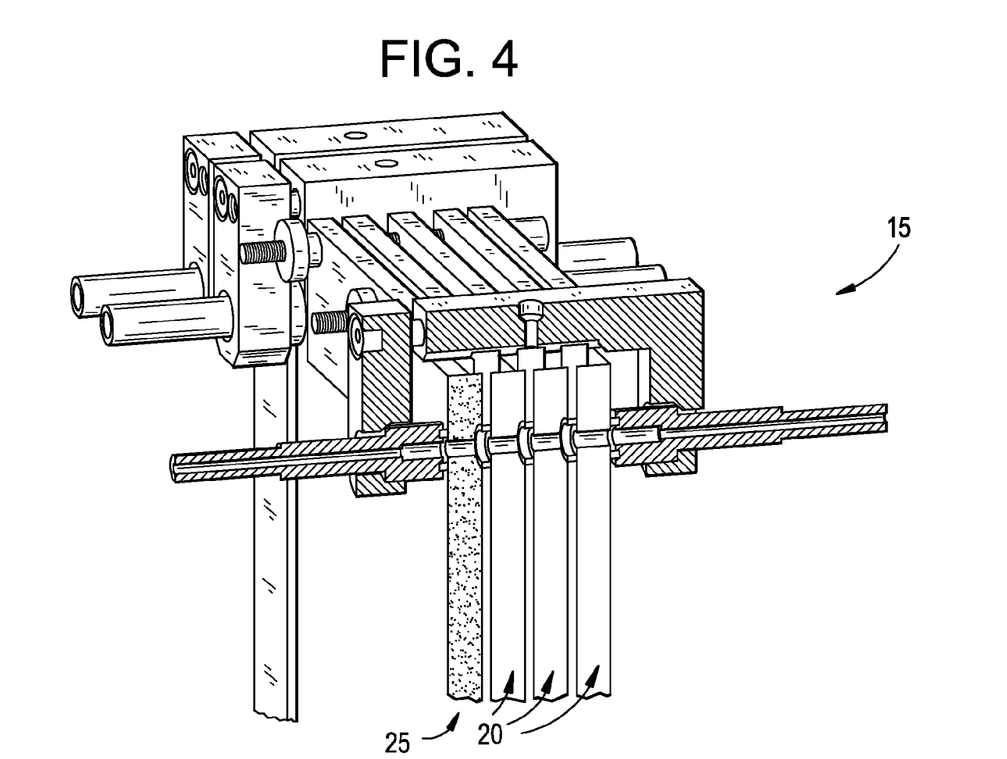
FIG. 4 is a perspective view depicting a unit of mechanically stacked microstructures according to one or more embodiments of the present disclosure.

Within hybrid microfluidic assemblies of the present disclosure, the microstructures may be configured in many ways. Different microstructure configurations offer different levels of integration and different levels of reactor simplification in terms of numbers of connections. In addition to the use of fluid conduit 50, discussed above, another potential microstructure configuration is the mechanical stacking of two or more microstructures. Mechanical stacking is a relatively flexible arrangement, which, by its non-permanent nature, allows individual microstructures that were once mechanically stacked to be separated and rearranged to form different configurations. Microstructures may be mechanically stacked by connecting the inlet and outlet ports of adjacent microstructures using only an O-ring seal 58 compressed between the two microstructure surfaces, as shown in FIGS. 3 and 4. Thus, fewer and less complex connections are required as compared to the use of a fluid conduit 50.

Figure 5:
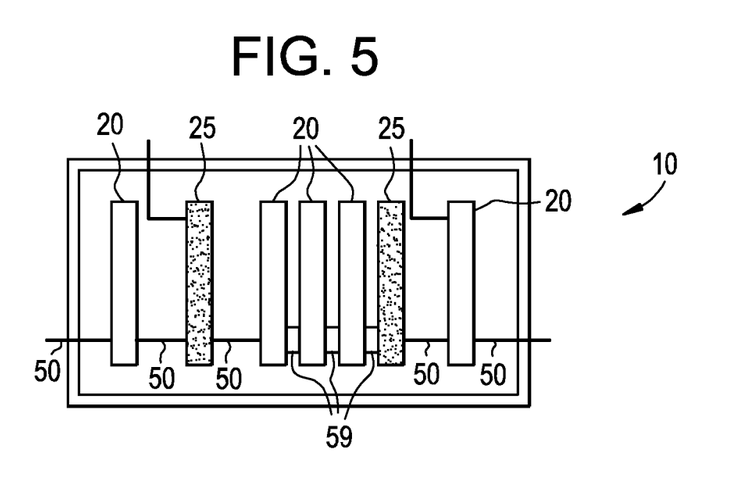
FIG. 5 is a hybrid microfluidic assembly according to one or more embodiments of the present disclosure, wherein the microstructure assembly includes permanent stacking.

Another potential microstructure configuration is the permanent stacking of two or more microstructures. Permanent stacking is less flexible because it does not allow the microstructures that have been permanently stacked to be easily separated and rearranged; however, permanent stacking is advantageous in certain circumstances because it requires even less complex connections than does mechanical stacking. By sealing microstructures together with a connection pad 59, O-ring seals 58 are avoided. As shown in FIG. 5, microstructures may be permanently stacked by sealing adjacent microstructures together with a connection pad 59, which may comprise glass, wherein the connection pad 59 has a fluid passage to connect the inlet and outlet ports of adjacent microstructures. The connecting pad may comprise a glass pad fused to the adjacent microstructures. When a permanent stacking configuration is used, specific materials for the microstructure and connection pad 59 may be selected to minimize the thermal expansion differential. For example, when a non-transparent microstructure 25 is permanently stacked via a glass connection pad 59, the thermal expansion differential between the ceramic microstructure and glass connection pad may be minimized to prevent excessive residual stresses which can cause premature failure or enhance slow crack growth mechanism (fatigue). For example, silicon carbide has an average thermal expansion of about 35-45×10−7/° C. (RT-1000° C.), so compatible glasses would possess an average thermal expansion of about 30-40× 10-7/° C. (RT-300° C.) in order to achieve minimal expansion differential (<100 ppm) between −80° C. and 300° C.

Figure 6:
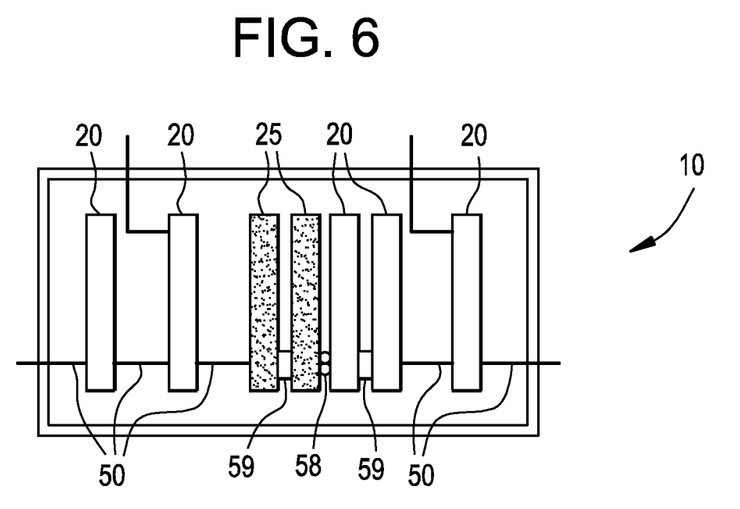
FIG. 6 is a hybrid microfluidic assembly according to one or more embodiments of the present disclosure, wherein the microstructure assembly includes mechanical stacking and permanent stacking.

As shown in FIG. 6, a microstructure configuration according to the present disclosure may include both mechanical stacking (accomplished in FIG. 6 via O-ring seal 58) and permanent stacking (accomplished in FIG. 6 via connection pad 59). Transparent microstructures 20 and non-transparent microstructures 25 may be combined in any reactor position and configuration, as indicated in FIGS. 1-7.

Figure 8:
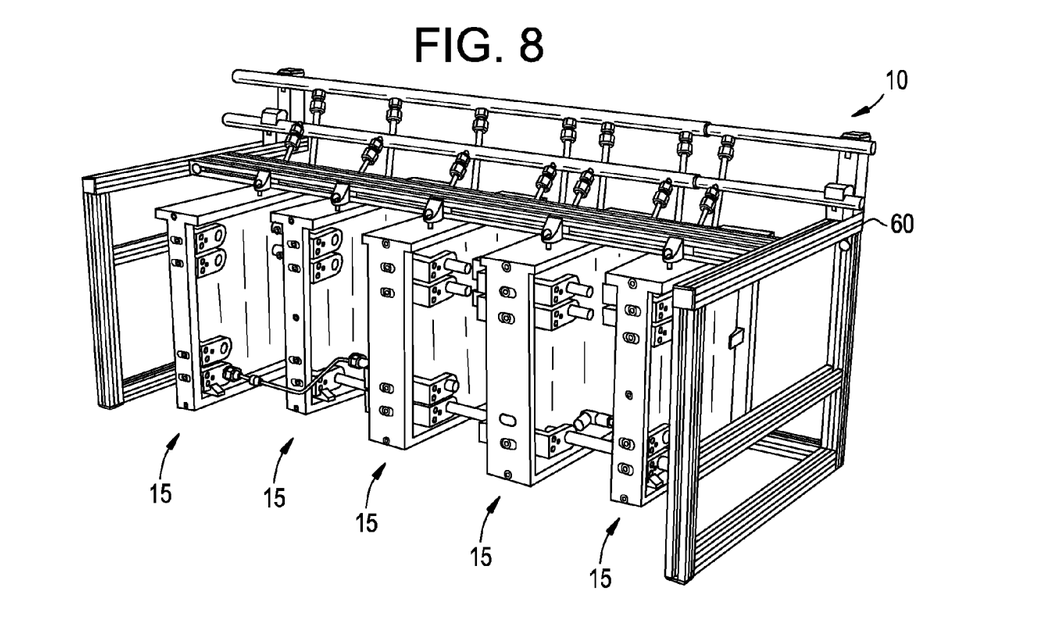
FIG. 8 is a hybrid microfluidic assembly according to one or more embodiments of the present disclosure.

As shown in FIG. 8, a hybrid microfluidic assembly 10 may comprise a microfluidic assembly housing 60. This microfluidic assembly housing 60 may include a plurality of units 15, or microstructure modules, of transparent microstructures 20 or non-transparent microstructures 25. In this embodiment, each unit 15 is in fluid communication with at least one other unit 15, and the units 15 may be joined by fluid conduits 50. In some embodiments, a unit 15 may comprise only a single microstructure. In others, as discussed below, a unit 15 may comprise a plurality of microstructures, typically four, that have been mechanically or permanently stacked. Transparent microstructures 20 and non-transparent microstructures 25, each of which may serve one or more different functions, may be interchangeably positioned within a microfluidic assembly housing 60 to form different microfluidic assembly configurations. For example, in a microfluidic assembly comprising four microstructures, the microfluidic assembly may be redesigned by moving one microstructure to another position, or by adding another microstructure to the assembly or substituting another microstructure to take the place of an existing microstructure. Further, one or more of the microstructures may be reconfigured to be connected in a different manner, for example, by mechanically or permanently stacking such microstructures, or, if such microstructures were mechanically stacked, by separating and reconnecting in a different fashion. Thus, microfluidic assemblies of the embodiments of this disclosure may provide design flexibility via the ability to design different microfluidic assemblies simply by repositioning, interchanging, or reconnecting the microstructures.

Figure 9:
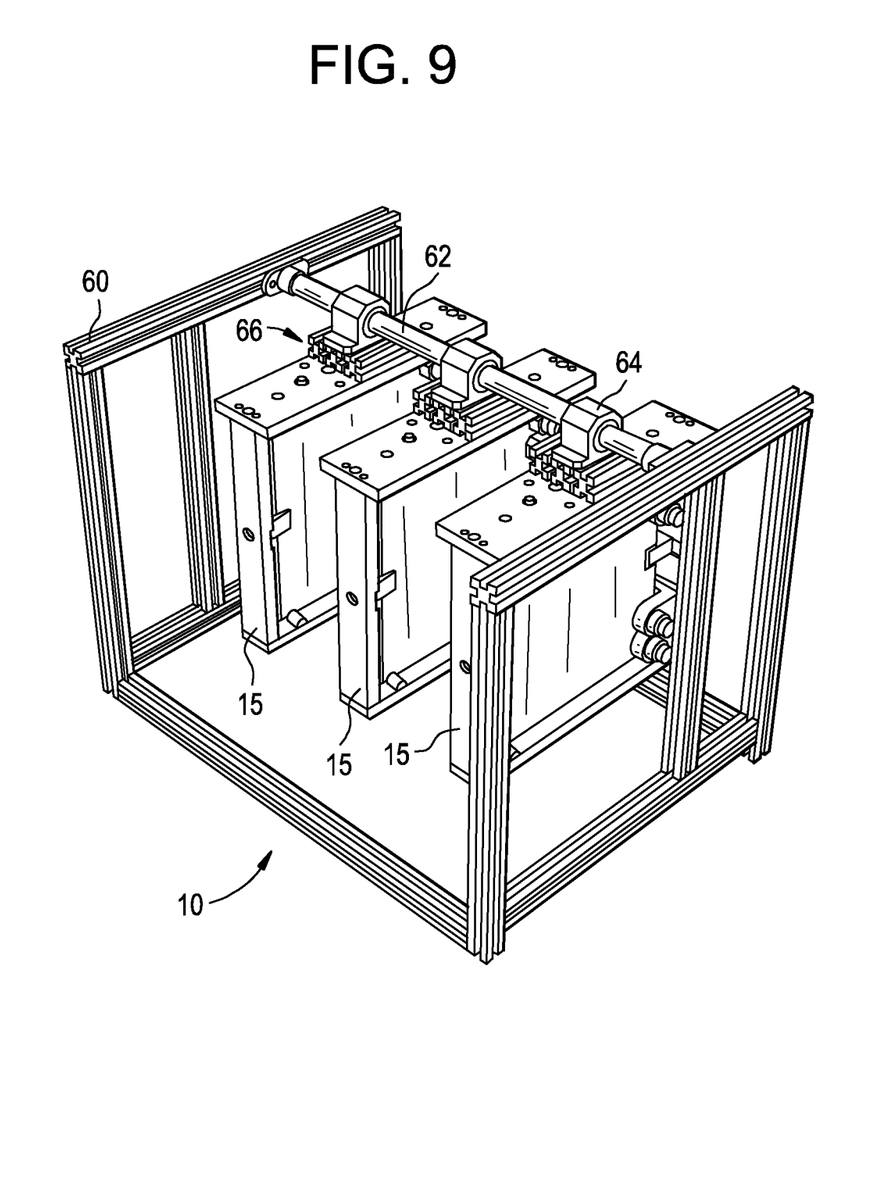
FIG. 9 is a hybrid microfluidic assembly according to one or more embodiments of the present disclosure.

According to one embodiment of the disclosure, at least one of the at least two microstructures is moveably disposed in the microfluidic assembly housing such that the at least two microstructures are moveable with respect to each other. For example, as disclosed in WO 2010/132412, microstructures or microstructure modules comprising one or more microstructures, may be independently supported on an extended structural support member of the microfluidic assembly housing by a support structure that is adjustable in two directions, one being the direction parallel to the long direction of the extended member and the other being the direction perpendicular to the long direction of the extended member. This arrangement allows for easy assembly and easy individual replacement of microstructures or units 15 comprising one or more microstructures. As shown in FIG. 9, the elongated structural support member is in the form of a rod 62, on which are carried individual linear bearings 64 as part of the respective connecting support structure 66. Such an arrangement allows for low friction and ease of moving microstructures or microstructure modules in the direction parallel to the length of the support member (here, rod 62). Such low friction support could also allow a small degree of motion of units 15 relative to one another during operation of the microfluidic assembly to accommodate thermal expansion of the fluid conduit 50.

Incorporating both transparent microstructures 20 and non-transparent microstructures 25 into a single microfluidic assembly combines the advantages of non-transparent materials, including many enhanced mechanical and thermal properties, with the ability to visually access the process via transparent microstructures. As discussed herein, both transparent and non-transparent materials have specific advantages and drawbacks in connection with their use in microstructures. Mixing microstructures formed of these materials within a single hybrid microfluidic assembly allows selection of the best material for a given function of the reactor and, therefore, allows a better reactor to be designed to intensify reaction with appropriate safety and customer requirements. Further, because, according to some embodiments of the disclosure, each individual microstructure within the hybrid microfluidic assembly is formed of the same type of material (although each distinct microstructures may be formed of a different type of material), there is little to no thermal expansion differential between contrasting materials. This minimal thermal expansion differential allows such hybrid microfluidic assemblies to better handle thermal extremes and extends the life of such assemblies.

Hybrid microfluidic assemblies of some embodiments of the disclosure include at least one transparent microstructure 20, comprising transparent material and substantially free of non-transparent material, and at least one non-transparent microstructure 25, comprising non-transparent material and substantially free of transparent material. As used herein, a microstructure comprising transparent material that is substantially free of non-transparent material is itself substantially transparent. Substantially transparent, as used here, means comprising a material having at least 50% transmission percentage at 3 mm thickness. In an exemplary embodiment, the transmission percentage is about 50% at a wavelength of about 316 nm and increases to about and remains at about 89-91% between wavelengths of 392 nm and 2500 nm. In another exemplary embodiment, the transmission percentage is about 75% at a wavelength of about 338 nm. In another exemplary embodiment, the transmission percentage is about 89 to about 91% between wavelengths of about 392 nm and 2500 nm, all with a material sample of 3 mm thickness.

A substantially transparent microstructure may contain a small amount of non-transparent material so long as the resulting microstructure remains substantially transparent. As used herein, "substantially free" means less than 1% by weight, or zero. As used herein, a microstructure comprising non-transparent material that is substantially free of non-transparent material may contain a small amount of transparent material so long as no portion of the resulting microstructure is transparent. According to some embodiments of the disclosure, the transparent microstructures 20 may be formed of glass, and the non-transparent microstructures 25 may be formed of ceramic material, for example, silicon carbide. According to some embodiments of the invention, the transparent microstructures 20 comprise Jade™ glass from Corning Incorporated. Hybrid microfluidic assemblies of certain embodiments of the disclosure include individual microstructures formed of glass and also include individual microstructures formed of silicon carbide. By using the same materials throughout a single microstructure, the thermal expansion differential will be minimal, the stress on the microstructure will be reduced, and the life of the microfluidic assembly may thereby be increased.

In some embodiments, the hybrid microfluidic assembly of the present disclosure may include individual microstructures that combine transparent and non-transparent materials, for example, glass and silicon carbide. For example, such a microstructure may have a reaction layer made of silicon carbide for high chemical resistance and high heat conductivity, and heat exchange layers made of glass to have visual contact with thermal fluid (for example, to detect fouling).

Transparent material may be advantageous for many microstructure functions. Some chemical reactions are activated by UV or visible light; under such circumstances, a transparent microstructure may allow light to enter and activate the reaction. Transparent microstructures may also be necessary or advantageous for numerous online optical analysis methods, including IR, Raman, and light scattering. Monitoring a process via a transparent microstructure may provide key information on the process evolution, may provide advanced indicia of potential problems to permit preventative or corrective action, and may provide useful information on the evolution of a reaction, such as when a chemical transformation occurs with a color change. For example, when a nitration starts to turn into an oxidation, a brow-yellow vapor appears, which can be detected either by visual inspection or by a camera fitted with image analysis. Transparency may also provide useful information on a flow pattern in case of liquid-gas flow, and it can facilitate the detection of a plugging in a microchannel. When a deposit starts to occur, it may not be detected by pressure drop variation. To avoid a blockage of the channel, early action may be required. Visual inspection (by the operator or in an automatic mode) may allow anticipation (and therefore prevention of) a full blockage of the equipment.

Glass materials are generally desirable for use in microstructures because they provide good chemical resistance, especially in acid conditions. Glass offers a wide range of chemical compatibility with processed chemicals, robust manufacturing processes with a very good accuracy and reproducibility, and good resistance to thermal shock due to its low thermal expansion coefficient. However, glass has poor chemical resistance to bases at high concentration and high temperature, poor resistance to mechanical shock (such that glass is less impact resistant than other materials, including many ceramics), and the low thermal conductivity of the material, even when a reactor is properly designed, can lead to surprisingly high overall thermal heat transfer coefficient. The poor electrical conductivity of the glass may also lead, when used with a liquid having a very high electrical resistivity, to issues regarding static electricity and explosiveness hazard classification (according to NEC 505). Addressing such issues may increase the complexity of the system.

Microstructures formed from non-transparent materials do not provide the advantages mentioned above for process control. However, non-transparent materials, such as metal and ceramics, may have better thermal conductivity, good resistance to bases (although metal, generally speaking, is less resistant to acids than is glass), better mechanical properties, and, primarily for metal, better resistance to mechanical shock. Metals are good electrical conductors, and some ceramics are semi-conductors. Silicon carbide is a semiconductor material and avoids accumulation of electrical charges. For example, having a heat exchange microstructure made of silicon carbide can reduce risk of electrical breakdown when dielectric fluid (e.g., silicone oil) is used as thermal fluid. Electrostatic charges can be evacuated through the silicon carbide microstructure. In addition, sintered silicon carbide material is generally three to four times stronger than engineered glass.

In designing a hybrid microfluidic assembly, the properties of transparent and non-transparent materials may be considered, and a hybrid microfluidic assembly may be designed to take advantage of the differences of the properties of these materials. For example, in a microfluidic assembly consisting of silicon carbide microstructures, a glass microstructure may be included to allow visual contact with reactants. This window may be used to detect boiling, change of color, clogging etc. It also may provide an opportunity to implement inline optical analysis. According to another embodiment of the disclosure, a photochemical reaction may be initiated in a glass microstructure, with the reaction continuing into a silicon carbide microstructure. Incorporation of transparent microstructures may enable performing photochemistry, including initial illumination of initiators or all along the reactor intermittently.

In a microfluidic assembly consisting of glass microstructures, a silicon carbide microstructure may be included to compensate for some of the disadvantages of glass microstructures. For example, a silicon carbide microstructure may address specific local corrosion issues. As indicated above, especially in basic conditions, glass may have poor corrosion resistance. For example, NaOH may be injected in a neutralization step of a reaction. In such a case, the majority of the microstructures may be made of glass, but silicon carbide microstructures may be used for parts of the process requiring chemical resistance to base. If a reaction step requires or results in a higher pressure, use of silicon carbide microstructures for that step may be advantageous to increase lifetime of the reactor. Similarly, if a reaction step requires abrasion resistance, such as when a chemical reaction step involves conveyance of a solid (e.g., a catalyst), microstructures made of silicon carbide may be used for that step. A silicon carbide microstructure also may be used to provide locally higher heat transfer to handle high exothermic reactions, for example, in a mixing microstructure, while glass heat transfer may be sufficient for a residence time section.

In one embodiment of the disclosure, a first microstructure or series of microstructures are formed of metal or ceramic, such as silicon carbide (for heat transfer purpose or mechanical reasons), whereas a later microstructure or series of microstructures are formed of a transparent material to allow online process analysis, with a feed back control loop to monitor closely the process. In this embodiment, because the transparent microstructures are located near the end of the reactor, the operating pressure of the transparent microstructures would be lower than that of the microstructures in the upper part of the reactor. As a result, the mechanical stress to the transparent microstructure would be lower, meaning that the overall mechanical resistance and lifetime of the reactor would be equivalent to the mechanical resistance and lifetime of the upper part including metal or ceramic microstructures.

In another embodiment of the disclosure, a first microstructure or series of microstructures are formed of transparent material to allow the initiation of a radical reaction by UV light, whereas a later microstructure or series of microstructures may be in metal or ceramic, allowing, for example, an improved heat transfer during the reaction. Further, additional transparent microstructures may be provided to provide illumination at more than one location along the reaction path.

In another embodiment of the disclosure, a first microstructure or series of microstructures are formed of glass, and the last microstructure is formed of silicon carbide. This arrangement may be advantageous, for example, in a nitration, when it is important from a safety point of view to confirm that no nitrous fume (brown-yellow) will appear, meaning that an oxidation process is happening. In such a process, the last microstructure, a non-transparent structure, may be devoted to the neutralization of the remaining nitric acid with soda. For such a step, a silicon carbide microstructure is more resistant to corrosion by soda (before mixing) than a glass microstructure would be.

In another embodiment of the disclosure, mixing steps may be conducted in transparent microstructures to monitor the potential plugging of the mixing zone and allow the microstructure to be flushed before a blockage occurs.

In another embodiment of the disclosure, where several microfluidic assemblies are placed in parallel for larger industrial applications, according for example to EP 2 193 839 A1, the part of the microfluidic assemblies where the fluids are distributed in a passive mode (that is, where the evenness of the distribution is driven only by the evenness of the pressure drop of each reactor) may be made of glass to take advantage of the accuracy of the manufacturing process of such microstructures. The resulting pressure drop will be more equal, thereby leading to a cheaper and more efficient distribution system.

According to one embodiment of the disclosure, a method of processing fluids or mixtures of fluids with a hybrid micro fluidic assembly is provided. Such method comprises: introducing a fluid into a hybrid microfluidic assembly, as described herein, wherein at least one microstructure comprises transparent material and is substantially free of non-transparent material, and at least one microstructure comprises non-transparent material and is substantially free of transparent material. The method further comprises processing the fluid within the hybrid microfluidic assembly, wherein processing comprises mixing, separating, extracting, crystallizing, precipitating, or combinations thereof. According to another embodiment of the invention, a method of processing fluids or mixtures of fluids with a hybrid microfluidic assembly further comprises monitoring the process through at least one of the microstructures comprising transparent material, conducting online optical analysis, and/or activating chemical reactions within transparent microstructures with UV or visible light.

For the purposes of describing and defining the present invention it is noted that the terms "approximately", "about", "substantially" or the like are utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue. Moreover, although the term "at least" is utilized to define several components of the present invention, components which do not utilize this term are not limited to a single element.

Having described the claimed invention in detail and by reference to specific embodiments thereof, it will be apparent that modifications and variations are possible without departing from the scope defined in the appended claims. More specifically, although some aspects are identified herein as preferred or particularly advantageous, it is contemplated that the present claims are not necessarily limited to these preferred aspects.

The invention claimed is:

1. A hybrid microfluidic assembly comprising a microfluidic assembly housing and a plurality of microstructures disposed in the microfluidic assembly housing, each microstructure comprising one or more internal fluid passages, wherein:
   selected ones of the plurality of microstructures are in fluid communication with at least one other microstructure;
   at least one of the selected microstructures comprises transparent material and is substantially free of non-transparent material; and
   at least one of the selected microstructures comprises non-transparent material and is substantially free of transparent material.

2. The hybrid microfluidic assembly of claim 1, wherein the transparent material comprises glass and the non-transparent material comprises ceramic.

3. The hybrid microfluidic assembly of claim 2, wherein the ceramic comprises silicon carbide.

4. The hybrid microfluidic assembly of claim 1, wherein at least one microstructure is fluidically connected to at least another microstructure by an interconnecting fluid conduit.

5. The hybrid microfluidic assembly of claim 4, wherein the interconnecting fluid conduit comprises a removable interconnecting fluid conduit, the removable interconnecting fluid conduit comprising tubing.

6. The hybrid microfluidic assembly of claim 4, wherein the interconnecting fluid conduit consists of a material that is substantially metal free.

7. The hybrid microfluidic assembly of any of claim 1, wherein at least two adjacent microstructures are mechanically stacked.

8. The hybrid microfluidic assembly of claim 7, wherein the at least two mechanically stacked microstructures are fluidically connected by an O-ring seal compressed between said adjacent microstructures.

9. The hybrid microfluidic assembly of claim 1, wherein at least two adjacent microstructures are permanently stacked.

10. The hybrid microfluidic assembly of claim 9, wherein the permanently stacked microstructures are sealed together by a connecting pad that is positioned between said adjacent microstructures, wherein said adjacent microstructures are fluidically connected to one another by a fluid passage within the connecting pad.

11. The hybrid microfluidic assembly of claim 10, wherein the connecting pad comprises a glass pad fused to the adjacent microstructures.

12. The hybrid microfluidic assembly of claim 1, wherein each of the microstructures further comprises a second internal fluid passage that is fluidically connected to a thermal fluid source.

13. The hybrid microfluidic assembly of claim 1, wherein the hydraulic diameters of the internal fluid passages range from approximately 0.4 mm to 12 mm.

14. The hybrid microfluidic assembly of claim 1, wherein at least one of the at least two microstructures is moveably disposed in the microfluidic assembly housing such that the at least two microstructures are moveable with respect to each other.

15. The hybrid microfluidic assembly of claim 1, wherein the microstructures may be interchangeably positioned to form different microfluidic assembly configurations.

16. A hybrid microfluidic assembly comprising a microfluidic assembly housing and a plurality of microstructures disposed in the microfluidic assembly housing, each microstructure comprising one or more internal fluid passages, wherein:
   selected ones of the plurality of microstructures are in fluid communication with at least one other microstructure;

at least one of the microstructures comprises transparent material and is substantially free of non-transparent material;

the remaining microstructures comprise non-transparent material and are substantially free of transparent material, wherein at least one microstructure comprises non-transparent material and is substantially free of transparent material; and wherein the microstructures may be interchangeably positioned to form different microfluidic assembly configurations.

17. The hybrid microfluidic assembly of claim 16, wherein the transparent material comprises glass and the non-transparent material comprises ceramic.

18. The hybrid microfluidic assembly of claim 17, wherein the ceramic comprises silicon carbide.

19. A method of processing fluids or mixtures of fluids with a hybrid microfluidic assembly, wherein the method comprises:

introducing a fluid into a hybrid microfluidic assembly, wherein the hybrid microfluidic assembly comprises a microfluidic assembly housing and a plurality of microstructures disposed in the microfluidic assembly housing, each microstructure comprising one or more internal fluid passages, wherein selected ones of the plurality of microstructures are in fluid communication with at least one other microstructure, at least one of the microstructures comprises transparent material and is substantially free of non-transparent material, and at least one of the microstructures comprises non-transparent material and is substantially free of transparent material;

processing the fluid within the hybrid microfluidic assembly, wherein processing comprises mixing, separating, extracting, crystallizing, precipitating, or combinations thereof.

20. The method of processing fluids or mixtures of fluids with a hybrid microfluidic assembly of claim 19, wherein the method further comprises monitoring the process through at least one of the microstructures comprising transparent material.

* * * * *